United States Patent
Woo et al.

(10) Patent No.: US 12,353,337 B2
(45) Date of Patent: Jul. 8, 2025

(54) METHODS AND CIRCUITS FOR AGGREGATING PROCESSING UNITS AND DYNAMICALLY ALLOCATING MEMORY

(71) Applicant: Rambus Inc., San Jose, CA (US)

(72) Inventors: Steven C. Woo, Saratoga, CA (US); Thomas Vogelsang, Mountain View, CA (US)

(73) Assignee: Rambus Inc., San Jose, CA (US)

( * ) Notice: Subject to any disclaimer, the term of this patent is extended or adjusted under 35 U.S.C. 154(b) by 133 days.

(21) Appl. No.: 18/025,571

(22) PCT Filed: Aug. 30, 2021

(86) PCT No.: PCT/US2021/048193
§ 371 (c)(1),
(2) Date: Mar. 9, 2023

(87) PCT Pub. No.: WO2022/060559
PCT Pub. Date: Mar. 24, 2022

(65) Prior Publication Data
US 2023/0342310 A1 Oct. 26, 2023

Related U.S. Application Data

(60) Provisional application No. 63/080,607, filed on Sep. 18, 2020.

(51) Int. Cl.
*G06F 13/16* (2006.01)
*G06N 3/048* (2023.01)
*G06N 3/084* (2023.01)

(52) U.S. Cl.
CPC ......... *G06F 13/1668* (2013.01); *G06N 3/048* (2023.01); *G06N 3/084* (2013.01); *G06F 2213/16* (2013.01)

(58) Field of Classification Search
CPC . G06F 13/1668; G06F 2213/16; G06N 3/048; G06N 3/084; H01L 23/49816; H01L 23/5383; H01L 25/18; H01L 2225/06541
(Continued)

(56) References Cited

U.S. PATENT DOCUMENTS 10,699,189 B2 6/2020 Lie et al.
2010/0157644 A1 6/2010 Norman
(Continued)

OTHER PUBLICATIONS

De Lima, Joao Paulo C. et al., "Exploiting Reconfigurable Vector Processing for Energy-Efficient Computation in 3D-Stacked Memories", Downloaded: <https://doi.org/10.1007/978-3-030-17227-5_19>, Springer Nature Switzerland AG 2019, 10.1007/978-3-030-17227-5_19, 15 pages.
(Continued)

*Primary Examiner* — Elias Mamo
(74) *Attorney, Agent, or Firm* — Silicon Edge Law Group LLP; Arthur J. Behiel

(57) ABSTRACT

An application-specific integrated circuit for an artificial neural network is integrated with a high-bandwidth memory. A processing die with tiled neural-network processing units is bonded to a stack of memory dies with memory banks laid out to establish relatively short connections to overlying processing units. The memory banks form vertical groups of banks for each overlying processing unit. A switch matrix on the processing die allows each processing unit to communicate with its vertical group of banks via a short, fast inter-die memory channel or with more remote groups of banks under neighboring processing units.

16 Claims, 12 Drawing Sheets

(58) Field of Classification Search
USPC .................................. 710/38, 305, 316, 317
See application file for complete search history.

(56) References Cited

U.S. PATENT DOCUMENTS

| | | | |
|---|---|---|---|
| 2015/0324290 A1* | 11/2015 | Leidel | G06F 13/1663 |
| | | | 711/141 |
| 2015/0332736 A1 | 11/2015 | Bringivijayaraghavan et al. | |
| 2015/0357010 A1 | 12/2015 | Jeddeloh | |
| 2016/0172271 A1 | 6/2016 | Ware et al. | |
| 2017/0139635 A1* | 5/2017 | Jayasena | G06F 12/0888 |
| 2018/0358056 A1 | 12/2018 | Lee et al. | |
| 2019/0392297 A1* | 12/2019 | Lau | G06N 3/04 |
| 2020/0135720 A1* | 4/2020 | Brewer | H01L 25/105 |
| 2020/0184001 A1* | 6/2020 | Gu | G06F 12/0802 |
| 2021/0182077 A1* | 6/2021 | Chen | G06Q 30/0241 |
| 2021/0319844 A1* | 10/2021 | Shi | G11C 29/4401 |

OTHER PUBLICATIONS

Rotenberg, Eric et al., "Rationale for a 3D Heterogeneous Multi-Core Processor", 2013 IEEE 31st International Conference on Computer Design (ICCD), Asheville, NC, 2013, pp. 154-168, doi: 10.1109/ICCD.2013.6657038, 15 pages.

Fujikoa, Yoshichika et al., "A Dynamically Reconfigurable VLSI Processor With Hierarchical Structure Based on a Micropacket Transfer Scheme", Downloaded: <https://www.researchgate.net/publication/319574898, Conference Paper Jul. 2017, 132-136. 10.1109/DT.2017.8024284, 6 pages.

Guo, Qi et al., "3D-Stacked Memory-Side Acceleration: Accelerator and System Design", 2014, Downloaded from <https://users.ece.cmu.edu/~franzf/papers/guo.pdf> on Jun. 4, 2020. 6 pages.

Kung, H.T. et al., "Maestro: A Memory-on-Logic Architecture for Coordinated Parallel Use of Many Systolic Arrays", in: 2019 IEEE 30th International Conference on Application-specific Systems, Architectures and Processors (ASAP), Jul. 15-17, 2019 [online] [retrieved on Dec. 14, 2021] Retrieved from the Internet ,URL:https://ieeexplore.ieee.org/document/8825148>, 10 pages.

Mutulu, Onur et al., "Enabling Practical Processing in and Near Memory for Data-Intensive Computing", 2019, pp. 1-5. 10.1145/3316781.3323476, arXiv:1905.04376v1 [cs.DC] May 2, 2019, 5 pages.

Notification of Transmittal of the International Search Report and the Written Opinion of the International Searching Authority, or the Declaration with Mail Date Feb. 1, 2022 re: Int'l Appln. No. PCT/US2021/048193. 12 pages.

* cited by examiner

Pass-Through Mode 200

Multi-Pass Mode 205

Rotation Mode 210

Multi-Pass Rotation Mode 215

Join Mode 220

Split Mode 225

METHODS AND CIRCUITS FOR AGGREGATING PROCESSING UNITS AND DYNAMICALLY ALLOCATING MEMORY

BACKGROUND

Modern computer processors are commonly "multi-core," which is to say that they include two or more separate processing units, or cores, spread across the chip area. In some architectures, the processing units are structured as regularly spaced "tiles." Tiled architectures work well for many applications, in part because they take advantage of parallelism and they avoid hot spots by evenly distributing computation and therefore power usage. Each tile/core/unit has access to its own memory bandwidth and capacity.

BRIEF DESCRIPTION OF THE DRAWINGS

The detailed description is illustrated by way of example, and not by way of limitation, in the figures of the accompanying drawings and in which like reference numerals refer to similar elements and in which:

FIG. 3 includes a functional representation of a neural network 300 over a processing unit 110 of the type introduced in FIG. 1 with like-identified elements being the same or similar.

FIG. 4 includes a functional representation of a neural network 400 over a portion of a processing die 405 similar to die 105 of FIG. 1 with like-identified elements being the same or similar.

DETAILED DESCRIPTION

Figure 1:
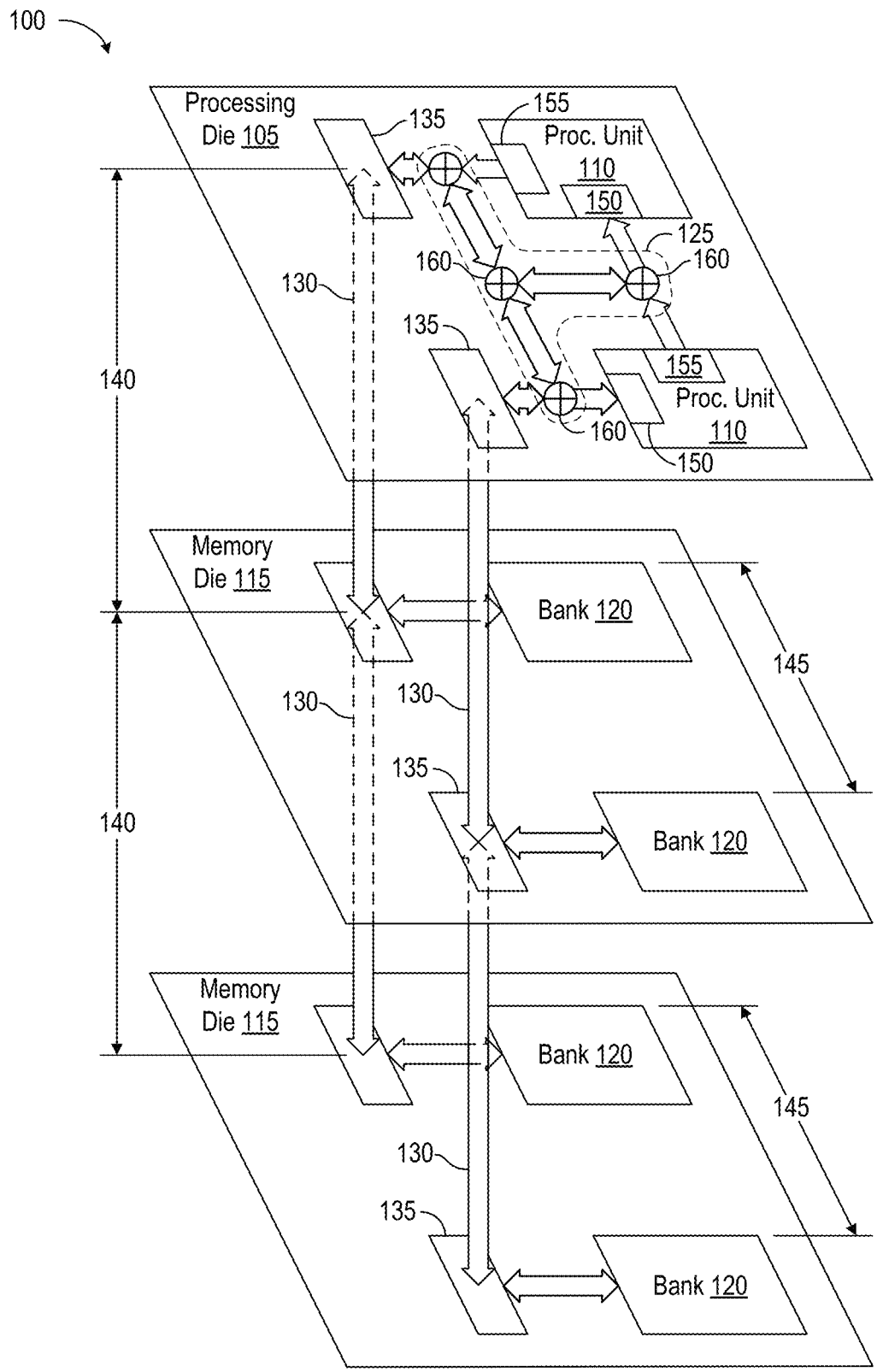
FIG. 1 illustrates a multi-core, three-dimensional (3D) application-specific integrated circuit (ASIC) 100 for an artificial neural network.

FIG. 1 illustrates a multi-core, three-dimensional (3D) application-specific integrated circuit (ASIC) 100. ASIC 100 includes a processing die 105 with tiled processing units 110 bonded to a stack of memory dies 115 (e.g., DRAM dies) with memory banks 120 laid out to establish relatively short connections to overlying processing units 110. Banks 120 form a high-bandwidth memory with vertical groups of banks for overlying processing units 110. A switch matrix 125 on processing die 105 allows each processing unit 110 to communicate with its nearest-neighbor (proximate) memory banks 120 via a short, fast inter-die memory channel 130 or more remote memory banks 120 via the inter-die memory channel 130 closer to a neighboring processing unit 110. The flexibility of connection provided by switch matrix 125 allows ASIC 100 to be configured to allocate memory speed and quantity among processing units 110.

Dies 105 and 115 are illustrated as separate but would be manufactured as stacked and bonded silicon wafers or dies communicatively coupled using via fields 135 (e.g. through-silicon vias or Cu—Cu connections) to establish inter-die connections (e.g. memory channels 130) so that the stack behaves as a single integrated circuit. Via fields 135 connect the dies so that the inter-die spacings 140 are physically shorter than memory-bank pitch 145. Processing units 110 are laid out over banks 120 and thus have an in-plane pitch similar to that of the banks. Processing units 110 can thus have faster access to underlying banks 120 than to those that underlie neighboring processing units.

Each processing unit 110 can be a graphics-processing unit (GPU), a tensor-processing unit (TPU), or any other form of processor or processors that benefits from access to high-performance memory. The processing units in the examples that follow are functionally similar systolic arrays in an artificial neural network.

Each processing unit 110 includes two ports in support of forward propagation, an input port 150 and an output port 155. Other ports supporting control and back propagation are omitted from this illustration but are detailed below. Switches 160 within switch matrix 125 allow processing units 110 to communicate with one another and to read from and write to their vertically proximate memory banks and those of their neighboring processing units.

Figure 2:
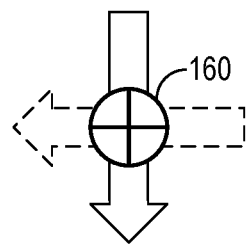
FIG. 2 depicts six connection modes of switches 160.
Figure 2:
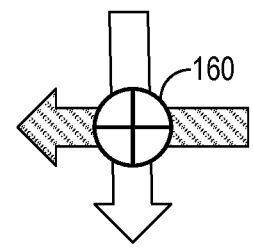
Figure 2:
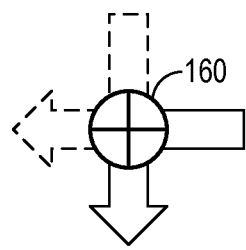
Figure 2:
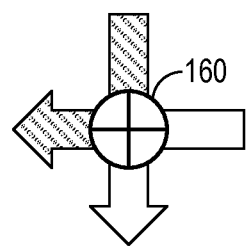
Figure 2:
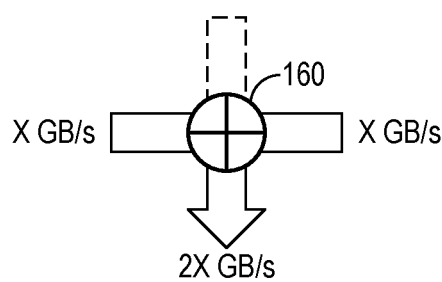
Figure 2:
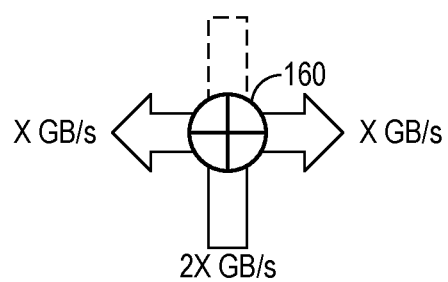

FIG. 2 depicts six connection modes of switches 160. A pass-through mode 200 conveys information straight through switch 160 in one direction; a multi-pass mode 205 passes information straight through switch 160 in two orthogonal directions; a rotation mode 210 receives information from a direction and conveys it through switch 160 at ninety degrees; a multi-pass rotation mode 215 receives different information from two directions and passes each at ninety degrees; a join mode 220 combines information from two directions to pass it on in the same direction at double the information bandwidth (e.g., two X GB/s signals become one 2X GB/s signal); and a split mode 225 reverses the join mode (e.g., one 2X GB/s signal to switch 160 becomes two X GB/s signals from switch 160). As we will see, this combination of capabilities allows switch matrix 125 to provide processing units 110 support for fast, flexible access to memory and separate or concurrent forward propagation (inference) and back propagation (adjustment of model parameters, or training).

Each switch mode in FIG. 2 illustrates unidirectional data flow through a switch 160 from an input direction to an output direction. In each example, the input and output directions can be different and switch 160 can support bidirectional data flow. In other embodiments the join mode can merge data from three inputs to one output, and the split mode can split one input into three outputs. Moreover, switches 160 in accordance with other embodiments can have more or fewer input or output nodes. The depicted orientations are thus illustrative and not limiting.

Figure 3:
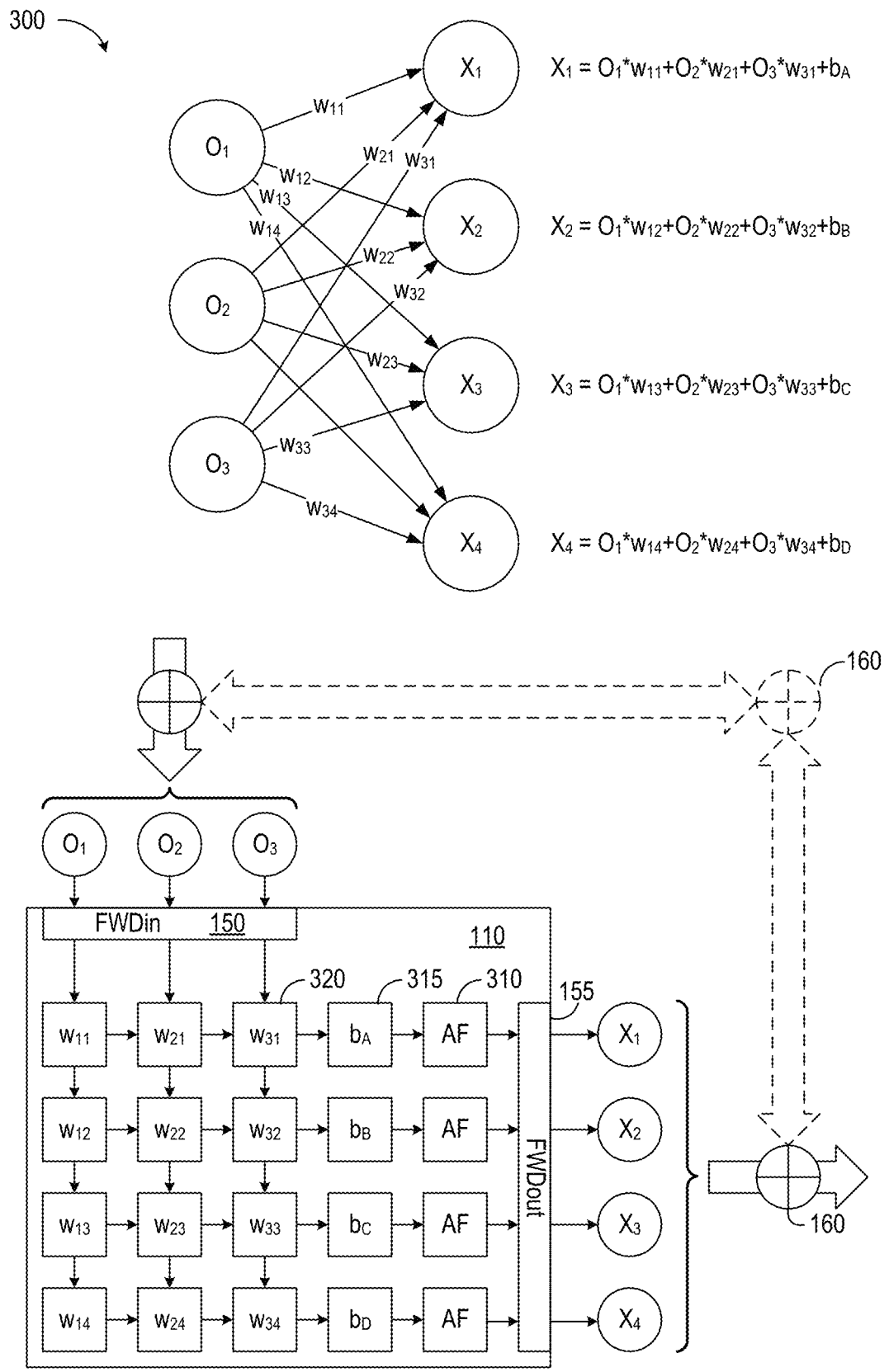

FIG. 3 includes a functional representation of a neural network 300 over a processing unit 110 of the type introduced in FIG. 1 with like-identified elements being the same or similar. The functional representation is typical of neural networks. Operands come in from the left, represented by a layer of neurons $O_1$, $O_2$, and $O_3$. The operands can be e.g. some form of input data for network 300 or partial results from upstream neurons. Computational results leave network 300 from the right via another layer of neurons $X_1$, $X_2$, $X_3$ and $X_4$. The two layers of neurons are connected by weighted connections $w_{ij}$, sometimes called synapses, the weightings of which are determined in training. The subscript of each weighting references the origin and destination of the connection. Neural network 300 calculates a sum of products for each output neuron following the equations shown in FIG. 3. A bias term b # references a bias neuron that is omitted from the functional representation for ease of illustration. Bias neurons and their use are well known so a detailed discussion is omitted.

With reference to the lower portion of FIG. 3, processing unit 110 includes forward-propagation input port 150, forward-propagation output port 155, and a systolic array of processing elements 310, 315, and 320. Data (e.g. partial results) represented by input and output neurons are stored in registers (not shown) within the processing elements. As used herein, "processing element" refers to an electronic circuit that performs arithmetic and logic operations using local, on-die memory or data provided directly from one or more of the memory dies without being stored in local on-die memory, and sharing input, output, or both with an interconnected processing element. "Processing unit" refers to a collection of processing elements sharing control circuitry that provides access to remote, off-die memory.

Processing unit 110 is initialized such that each processing element stores a corresponding weight value. Weight values $w_{11}$-$w_{34}$ are loaded into like-identified processing elements 320. Bias values are likewise loaded into elements 315. Once initialed, data is transmitted through processing unit 110, each input operand sequencing through a respective column in stepwise fashion. For each step, each processing element (1) computes a partial result as a function of the respective weight value $w_{x,y}$ and an incoming operand, (2) passes the incoming operand to a downstream element in the same column, and (3) passes the partial result to a downstream element in the same row. The array of processing elements thus presents output $X_1$-$X_4$ following the equations depicted adjacent network 300. In this example, operands $O_1$-$O_3$ enter processing element 110 in order on successive steps (e.g. clock cycles) and outputs $X_1$-$X_4$ leave in order on successive steps.

Elements 315 and 320 perform the calculations associated with forward propagation per the functional representation of neural network 300. In addition, each of elements 310 performs an activation function that transforms the output of that node in ways that are well understood and unnecessary for the present disclosure. The layers of input and output neurons are depicted for processing unit 110 as inputs and outputs and the weight computations are performed by processing elements 310, 315, and 320. Processing elements 315 include simple accumulators that add a bias to a value that is accumulating, whereas elements 320 include multiply-accumulators (MACs or MAC units), each of which computes the product of two operands and adds that product to an accumulating value. Each processing element 320 can include more than one MAC in other embodiments.

Figure 4:
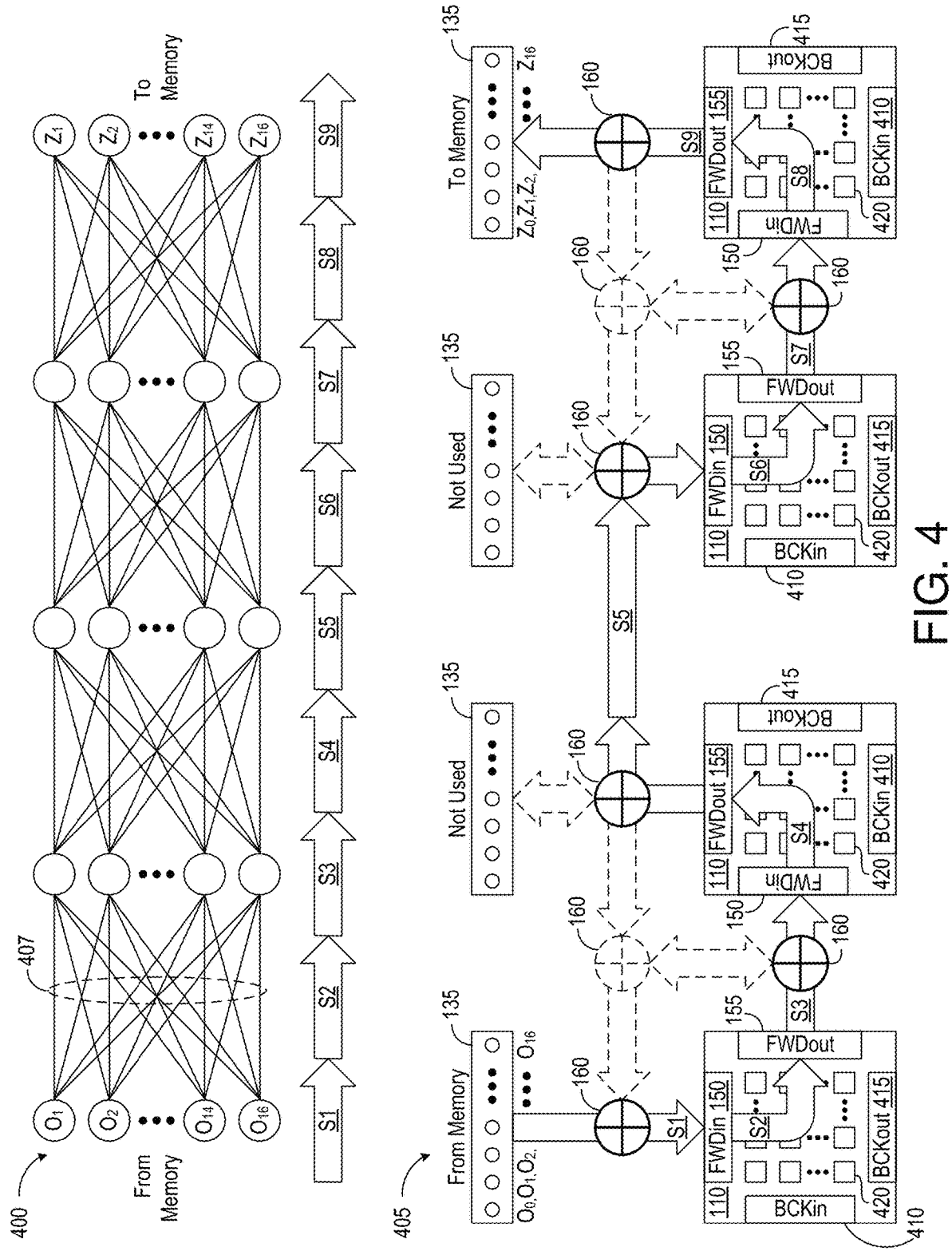

FIG. 4 includes a functional representation of a neural network 400 over a portion of a processing die 405 similar to die 105 of FIG. 1 with like-identified elements being the same or similar. The number of processing units 110 and related switches 160 and via fields 135 is doubled in comparison to the earlier example; a practical embodiment will have a great many more processing units and the switch matrix with its related connections and switches will be expanded accordingly. Each processing unit 110 includes a back-propagation input port 410 and a back-propagation output port 415, the purposes of which are discussed below.

With reference to the top half of FIG. 4, operands for network 400 come in from the left at a layer of sixteen neurons $O_1$ through $O_{16}$. In this example, each neuron receives its input from a memory. The process of loading these neurons is indicated by an arrow labeled S1 (step S1). These data are conveyed along weighted connections 407 (step S2) to arrive at the next layer of neurons (step S3). This process of forward propagation continues through three more sets of synapses and three more layers of neurons in this example, for nine illustrative steps S1-S9 in total, to deliver sixteen results $Z_1$ through $Z_{16}$ to the memory.

The four processing units 110 along the bottom of FIG. 4 instantiate neural network 400 using switches 160 in the pass-through and rotational modes as indicated by the solid arrows. The flow of data is illustrated with reference to the same steps S1-S9 used to label network 400. Unused switches 160 and related connections are depicted using broken lines.

The sequence of steps S1-S9 assumes processing units 110 are initialized with weight values, one for each synapse, by loading one weight value into each of 256 (sixteen by sixteen) processing elements 420 in each processing unit 110. Other initialization parameters (e.g. bias values, activation functions, and switch settings) are likewise loaded into the processing units. Each processing unit 110 can load its parameters from memory by way of the nearest via field 135, or parameters can be passed between processing units (e.g. following the path illustrated at the bottom of FIG. 4).

With the weight values and other parameters loaded, processing units 110 are ready to begin processing input data from memory. Beginning with step S1, data $O_{16}$-$O_1$ from the leftmost via field 135, which supports an inter-die memory channel to underlying memory dies 115 (FIG. 1), is read into forward-propagation input port 150 and propagated through a sixteen-by-eighteen array of processing elements 420 that are functionally similar to processing elements 320 of FIG. 3. In step S2, processing elements 420 in the leftmost processing unit 110 apply weights to the operands of step S1 to produce the partial results of step S3, themselves operands that are passed on to the next processing unit 110 in the series. This process of accumulating partial results continues as each processing unit 110 applies respective sets of weightings to incoming operands until, at step S9, the ultimate results $Z_{16}$-$Z_1$ are conveyed to the underlying memory dies via the inter-die memory channel represented by the rightmost via field 135. In this configuration the two middle inter-die memory channels and related memory resources are not used.

Figure 5:
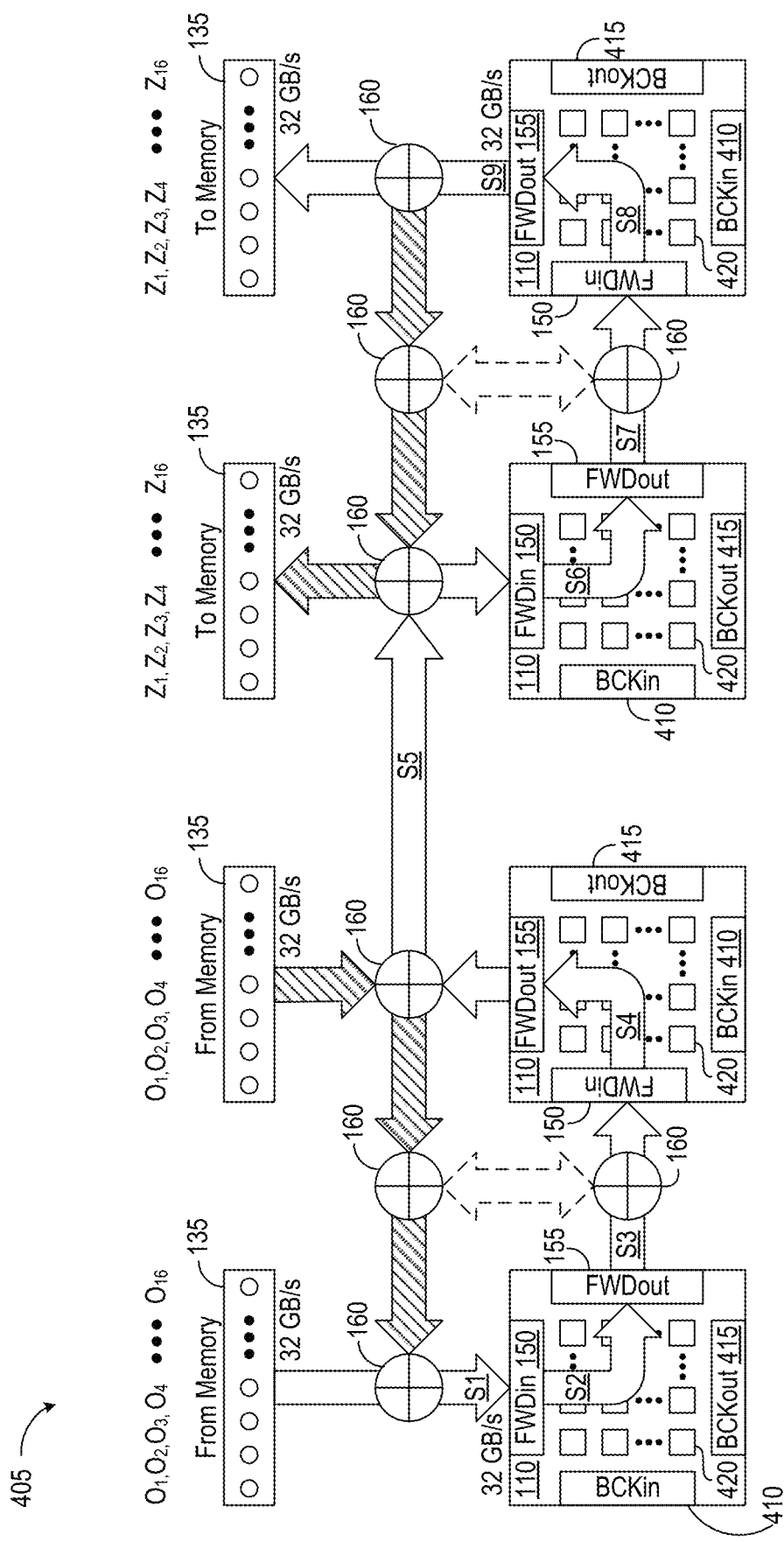
FIG. 5 depicts processing die 405 of FIG. 4 with the matrix of switches 160 in an alternative mode that allows processing units 110 access to additional memory.

FIG. 5 depicts processing die 405 of FIG. 4 with the matrix of switches 160 in an alternative mode that allows processing units 110 access to additional memory. The leftmost switch 160 alternates between pass-through mode 200 and rotational mode 210 (FIG. 2) to provide the leftmost processing unit 110 with access to each of the nearest via field 135 and, as indicated by shaded arrows, an adjacent via field 135 via two additional switches 160, one in pass-through mode 200 and the other in multi-pass rotation mode 215.

Each via field 135 provides access to a 32 GB/s memory channel in this example. The leftmost switch 160 allows input data $O_{16}$-$O_1$ to be read from either of two via fields, and thus doubles the amount of forward input data available from memory dies 115 to the leftmost processing unit 110. The rightmost three switches 160 are similarly configured to provide double the output memory capacity for the rightmost processing unit 110, allowing that processing unit 110 to write forward output data $Z_{16}$-$Z_1$ to memory via two alternative via fields 135 (the two rightmost via fields). The switch matrix thus doubles the accessible memory for the input and output processing units.

Figure 6:
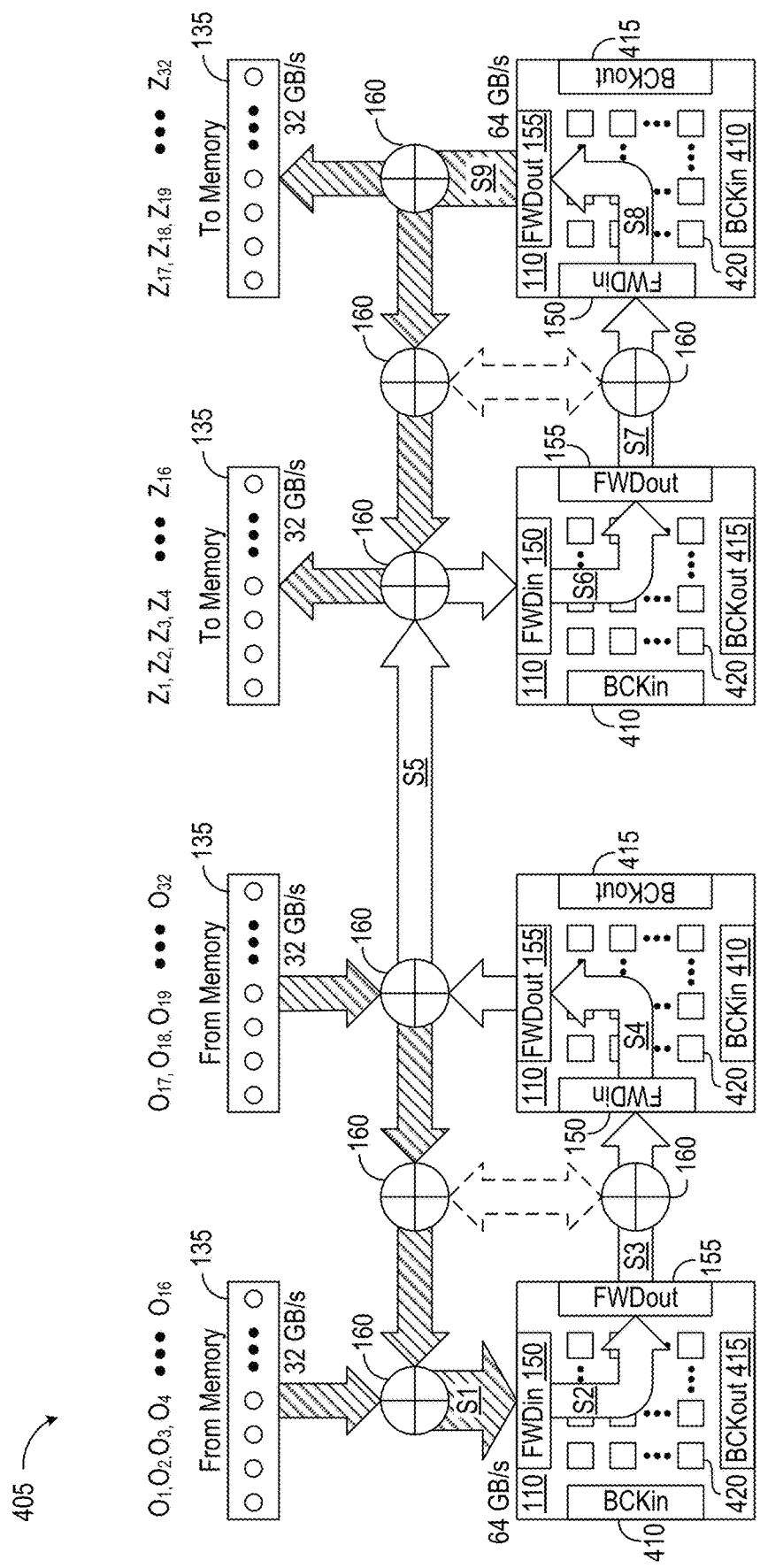
FIG. 6 depicts processor die 405 of FIGS. 4 and 5 with the switch matrix configured to allow double the data availability and double the bandwidth for processing units 110.

FIG. 6 depicts processor die 405 of FIGS. 4 and 5 with the switch matrix configured to allow double the data availability and double the bandwidth for processing units 110. The leftmost switch 160 is in join mode 220 to provide the leftmost processing unit 110 with simultaneous access to the nearest via field 135 and an adjacent via field 135 via two additional switches, one in pass-through mode 200 and the other in multi-pass rotation mode 215. Each via field 135 provides access to a 32 GB/s memory channel in this example, so joining two via fields provides forward input data $O_{32}$-$O_1$ at 64 GB/s to the leftmost processing unit 110. The rightmost three switches 160 are similarly configured to provide double the output memory capacity and bandwidth for forward output data $Z_{32}$-$Z_1$. The processing units can thus perform twice as many operations per second as compared with the embodiments of FIGS. 4 and 5.

Figure 7:
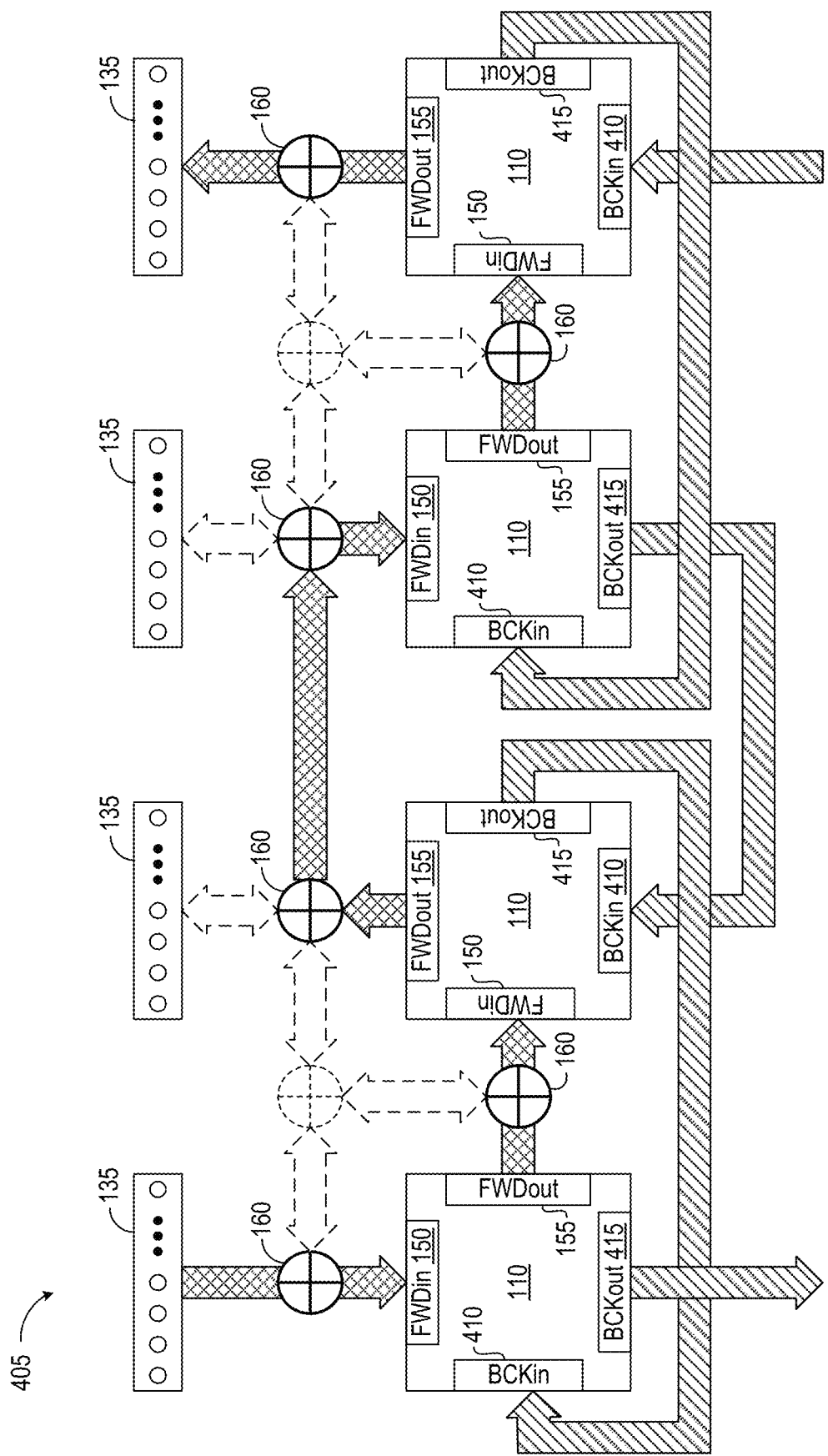
FIG. 7 depicts processor die 405, introduced in FIG. 4, illustrating how the switch matrix can be configured for concurrent forward and back propagation.

FIG. 7 depicts processor die 405, introduced in FIG. 4, illustrating how the switch matrix can be configured for concurrent forward and back propagation. The forward signal path enters the forward input port 150 of the leftmost processing unit 110 and traverses the remaining downstream tiles from left to right as indicated by shaded arrows that extend to forward input ports 150 and from forward output ports 155. The backward signal path proceeds in the opposite, upstream direction via back-propagation input ports 410 and output ports 415 along signal paths of common shading, each output port 415 delivering back-propagation partial results to back-propagation processors (not shown) in an upstream neighbor. Unshaded signal paths and switches 160 are not used in this mode, though they can be incorporated to increase memory capacity and bandwidth in the manner detailed previously. Forward and back propagation can proceed separately or concurrently.

In some embodiment some or all of the processing units on a given processing die can be convolutional units that perform convolution operations using a systolic array. Processing elements in a convolutional systolic array differ from other forms of neural networks. Reflecting their use in applying kernels, convolution nodes are locally connected to a small region of the width and height of a layer before it (e.g., a 3×3 or 5×5 neighborhood of image pixels), called a receptive field. Hidden-layer weights can apply convolutional filters to the receptive field. Convolutional processing elements (CPEs) can be arrayed within processing units in much the same way as are processing elements 320 of FIG. 3. CPEs can be adapted to alternatively support either convolution or other functions, such as those attributed to processing elements 320 of FIG. 3.

Figure 8:
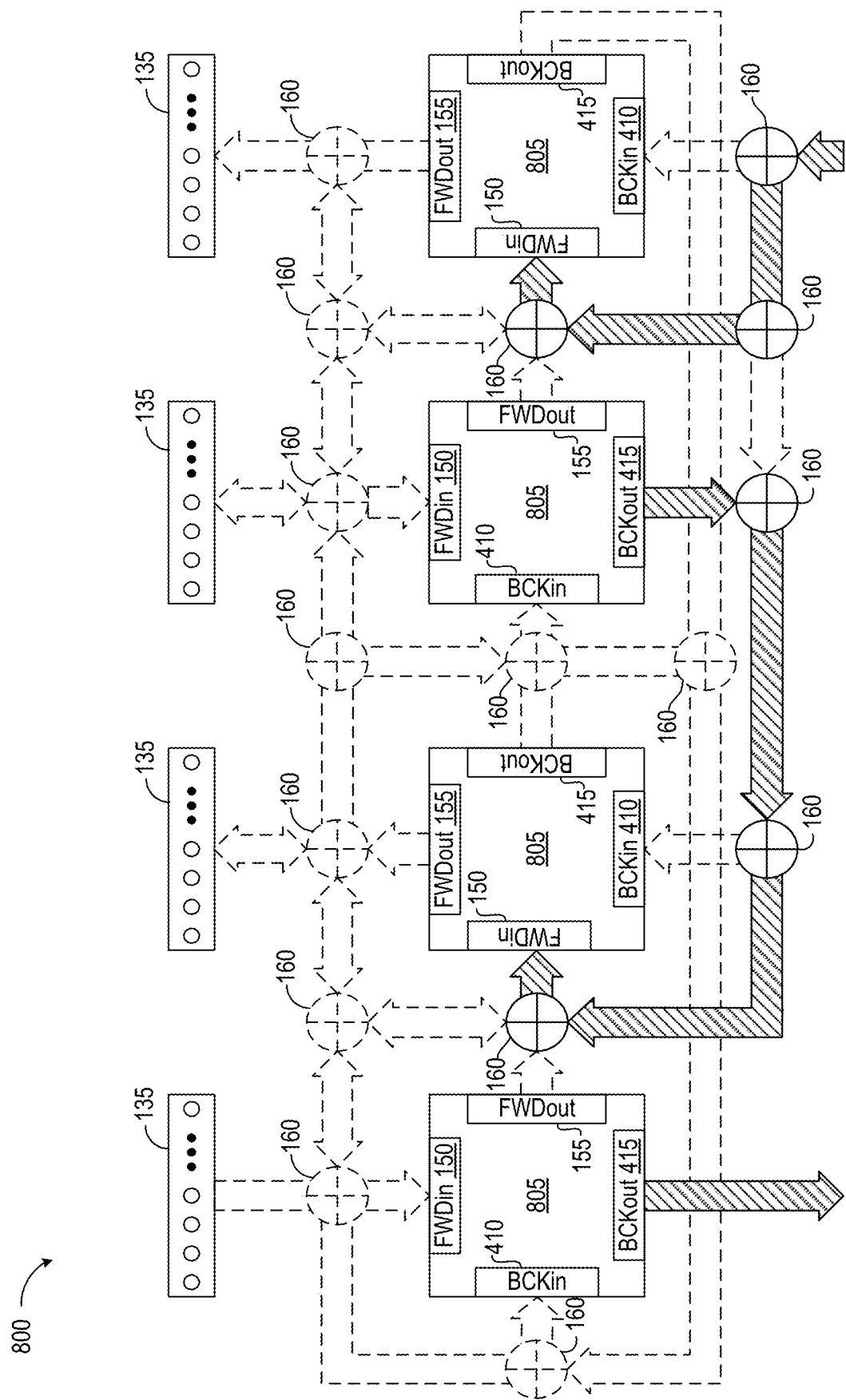
FIG. 8 depicts a processing die 800 with a switch matrix similar to those detailed above but incorporating additional switches 160.

FIG. 8 depicts a processing die 800 with a switch matrix similar to those detailed above but incorporating additional switches 160. As indicated using shaded arrows, switches 160 can be configured in a convolutional mode to support the shifting of kernels between processing units 805 by connecting the back-propagation output port 415 of some processing elements 805 to the forward-propagation input port 150 of a neighboring processing unit. The switch configurations can be changed during the course of computation so that operands can move between different ports in different ones of processing units 805 to effect other types of computations, convolutions in this example.

Figure 9:
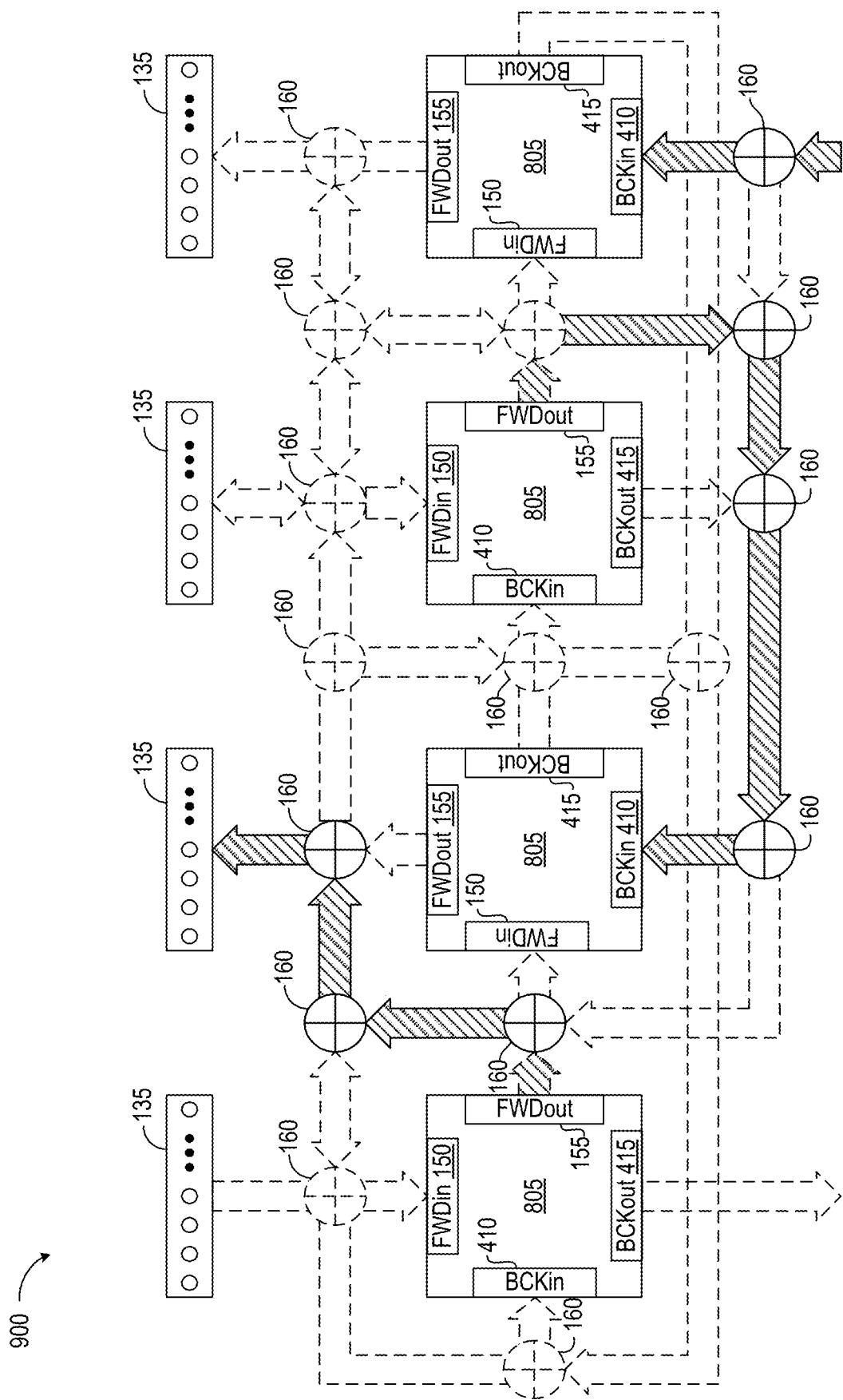
FIG. 9 depicts processing die 800 of FIG. 8 configured in another convolutional mode that supports the shifting of kernels over image data held within processing elements (not shown) within processing units 110.

FIG. 9 depicts processing die 800 of FIG. 8 configured in another convolutional mode that supports the shifting of kernels over image data held within processing elements (not shown) within processing units 805. Switches 160 connect the forward-propagation output port 155 of some of processing units 805 to the back-propagation input ports 410 of a neighboring processing unit.

Figure 10:
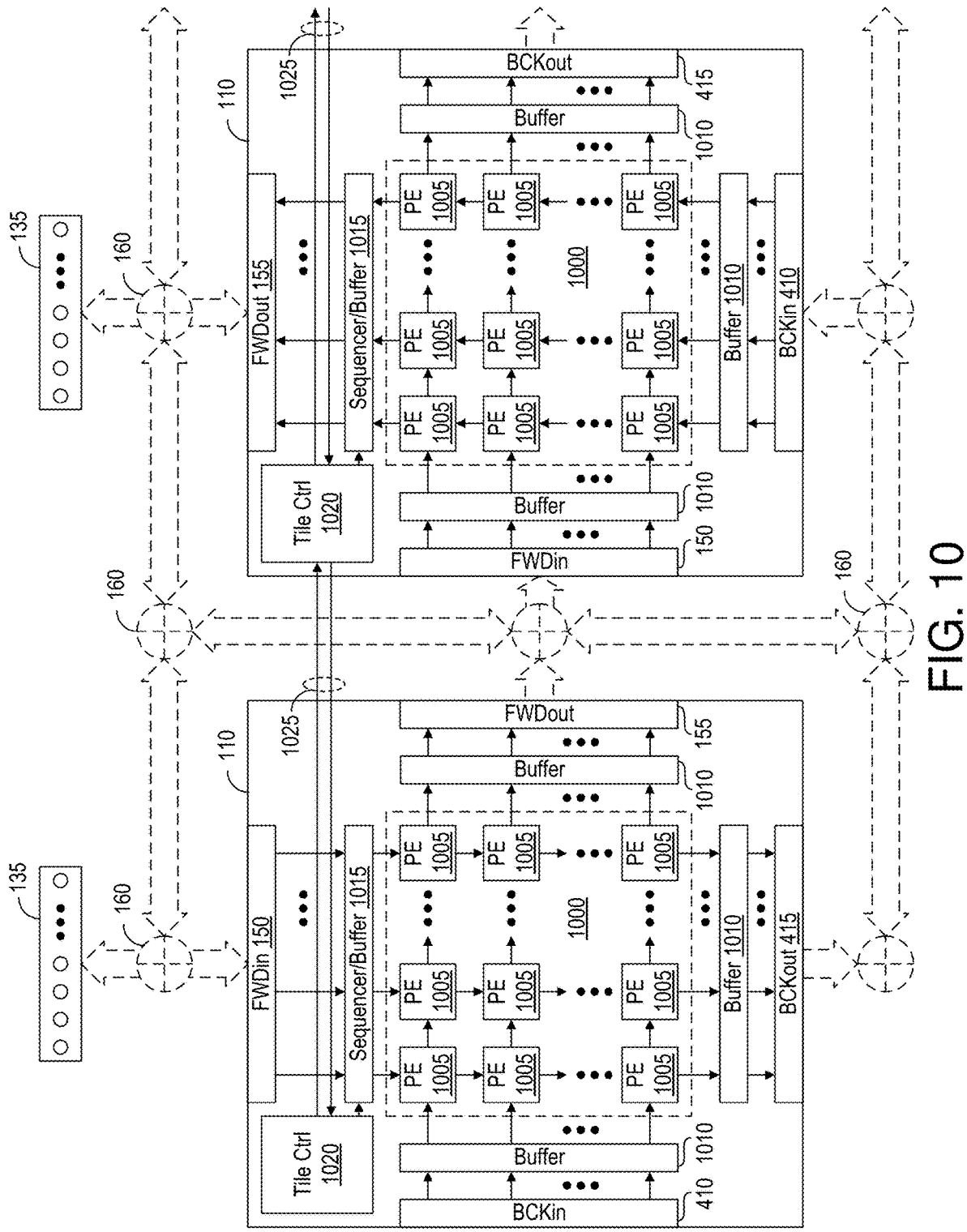
FIG. 10 depicts a pair of processing units 110, as described previously, and showing some additional elements that support memory sharing in accordance with one embodiment.

FIG. 10 depicts a pair of processing units 110, as described previously, and showing some additional elements that support memory sharing. Each processing unit 110 is a tile that includes an array 1000 of processing elements 1005 e.g. of the type detailed in connection with FIG. 3. A "tile" is a geometric area on an IC die that encompasses a circuit that is or is largely replicated to form tessellation of tiles. The switch matrix is depicted as outside of the tiles for ease of illustration but switches 160 and the related connections can be integrated with other tile elements within the tile boundaries. For example, memory transactions for a given processing unit 110 that take place over the proximate via field 135 can be managed by sequencer/buffer 1015 for any of the four input and output ports (e.g., the leftmost processing unit can write to memory by directing forward output port 155 to the leftmost via field 135 via sequencer/buffer 1015 using switches 160 that are incorporated into the processing tile).

Scratchpad and buffer logic 1010 and 1015 between the input and output nodes of array 1000 can be included to store and buffer input and output signals. The edge of each tile that communicates directly with memory via a respective via field 135 includes a sequencer 1015, possibly in combination with scratchpad and buffer logic. Sequencers are a simple and efficient class of memory controller that generates sequences of addresses to step though a microprogram, in this case to stream operands from and to memory banks 120 in underlying memory dies 115. A tile controller 1020 manages the flow of data through the various elements of each processing unit 110, including switches 160, as directed by instructions that can be streamed from the underlying memory. Inter-tile control connections 1025 between tile controllers 1020 allow one instance of processing unit 110 to control information flow to and from a neighboring processing unit. For example, tile controller 1020 of the left-most processing unit 110 can direct its local sequencer/buffer 1010 to stream data to or from underlying memory banks 120, or can direct neighboring tile controller 1020 to direct neighboring sequencer/buffer 1010 to stream data to or from the more remote memory banks 120 that underlie the rightmost tile.

Figure 11:
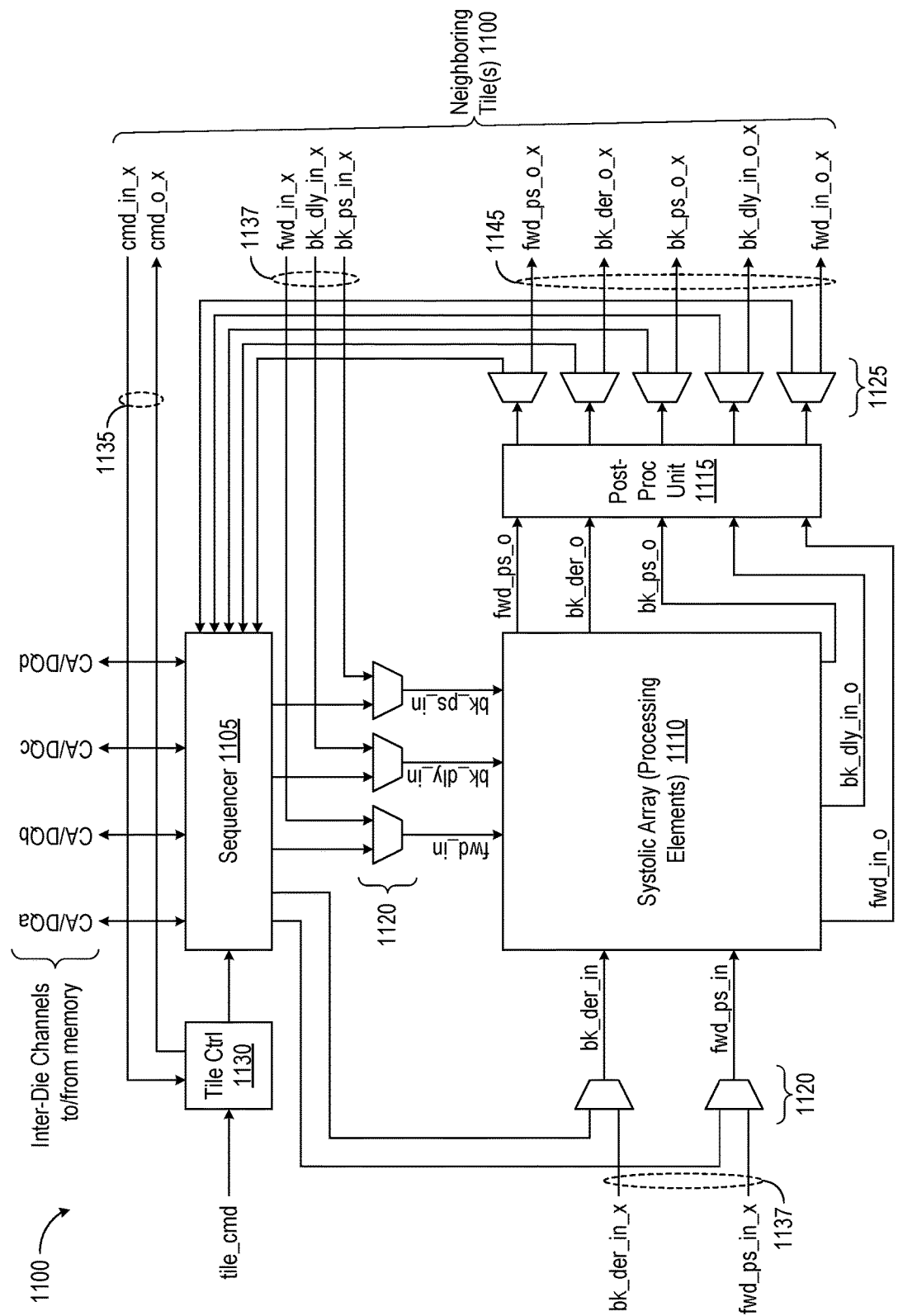
FIG. 11 depicts a processor-unit tile 1100 that incorporates portions of a switching matrix within the tile boundaries.

FIG. 11 depicts a processor-unit tile 1100 that incorporates portions of a switching matrix within the tile boundaries so that a tessellation of tiles 1100 supports the connectivity detailed previously. Tile 1100 includes a memory sequencer 1105, a systolic array 1110, a post-processing unit 1115, input switching logic depicted as a set of five input multiplexers 1120, output switching logic depicted as a set of five output demultiplexers 1125, and a tile controller 1130. Though most of the connections are omitted for ease of illustration, tile controller 1130 connects to and controls each of the other tile elements to manage the flow of data through tile 1100 responsive to tile commands tile_cmd from an external host. Tile controller 1130 can also receive commands cmd_in_x (for "command, input, external") from the tile controller 1130 of a neighboring tile 1100, or issue commands cmd_o_x (for "command, output, external) to the same neighboring tile. Inter-tile connections 1135 provide a control channel in support of this communication. The other tiles are functionally similar but can be laid out differently, as detailed previously, to promote efficient inter-tile signal routing.

Sequencer 1105 supports four memory channels CA/DQ [a,b,c,d], one to each of four underlying memory dies. Sequencer 1105 can, responsive to commands from tile controller 1130, issue read and write requests to any of the memory channels to read and write 256-bit data over any of the four channels. Multiplexers 1120 have first switching-logic input ports to sequencer 1105 and second switching-logic input ports to inter-tile input connections 1137 to a similar sequencer on a neighboring tile. Tile controller 1130 controls both the local and neighboring sequencers 1105, as well as the switching logic, so that either sequencer 1105 can stream data read from memory to systolic array 1110 as forward input fwd_in, back-propagation delayed input bk_dly_in, back-propagation partial-sum input bk_ps_in, back-propagation derivative input bk_der_in, or forward partial-sum input fwd_ps_in.

Application of these signals is well known in machine learning. Briefly, the five inputs from the switching-logic output port to systolic-array input ports are as follows:

forward input fwd_in receives input operands in forward propagation;

forward partial-sum input fwd_ps_in receives partial sums from memory or upstream processing units during forward propagation;

back-propagation partial-sum input bk_ps_in receives input operands from a downstream tile during back propagation;

back-propagation derivative input bk_der_in receives a derivative term from a downstream tile during back propagation; and back-propagation delayed input bk_dly_in is also a forward-propagation input but is delayed for use in pipelined back-propagation (The same input to a layer is needed for forward propagation and backpropagation, but with pipelined backpropagation on all layers except the last the weight change related to an input is calculated later than the forward input. Input bk_dly accommodates the resulting time shift).

Systolic array 1110 can provide five outputs responsive to the five inputs. These are forward partial-sum output fwd_ps_o, back-propagation derivative output bk_der_o, back-propagation partial-sum output bk_ps_o, back-propagation delay-input out bk_dly_in_o, and forward input out fwd_in_o. All outputs from array 1110 pass to post-processing unit 1115, which can modify the output using an activation (e.g., sigmoid, tanh, Softmax, and ReLU). Other output modifications can likewise be applied. Demultiplexers 1125 can pass these signals on to a neighboring recipient tile(s) 1100 (not shown) via inter-die output connections 1145 as signals that bear the same monikers but terminated in an "x" for "external" (external to the instance of tile 1100 that generated the output signal).

The foregoing discussion of tile 1100 illustrates the normal flow of operands for forward and back propagation. Multiplexers 1120, demultiplexers 1125, and related connectivity are a portion of a switch matrix distributed among tiles 1100 to provide configurable connectivity of the type detailed previously. Multiplexers in set 1120 can select all five sets of input data for systolic array 1110 from the sequencer 1105 of a neighboring tile 1100, for example, via external signals that bear the "x" termination to distinguish them from their local counterparts. Tile controller 1130 can direct the sequencer in an adjacent tile to stream data from an underlying memory die to multiplexers 1120, multiplexers 1120 to present these data to systolic array 1110. Tile 1100 can thus process data streamed via local channels CA/DQ[a,b,c,d] or similar channels to a neighboring tile. Some of the consequences of this connectivity are discussed in connection with e.g. the leftmost two processing units 110 of FIG. 5.

Demultiplexers 1125 allow tile controller 1130 to route the outputs from post-processing unit 1115 to sequencer 1105 or multiplexers 1120 of a neighboring tile. Some embodiments support additional switches that allow the outputs from post-processing unit 1115 to connect directly to the sequencer of a neighboring tile. Sequencer 1105 can write these data to memory or apply it as inputs to array 1110, as can the sequencer in the neighboring tile. Some of the consequences of this connectivity are discussed in connection with e.g. the rightmost two processing units 110 of FIG. 5.

Figure 12:
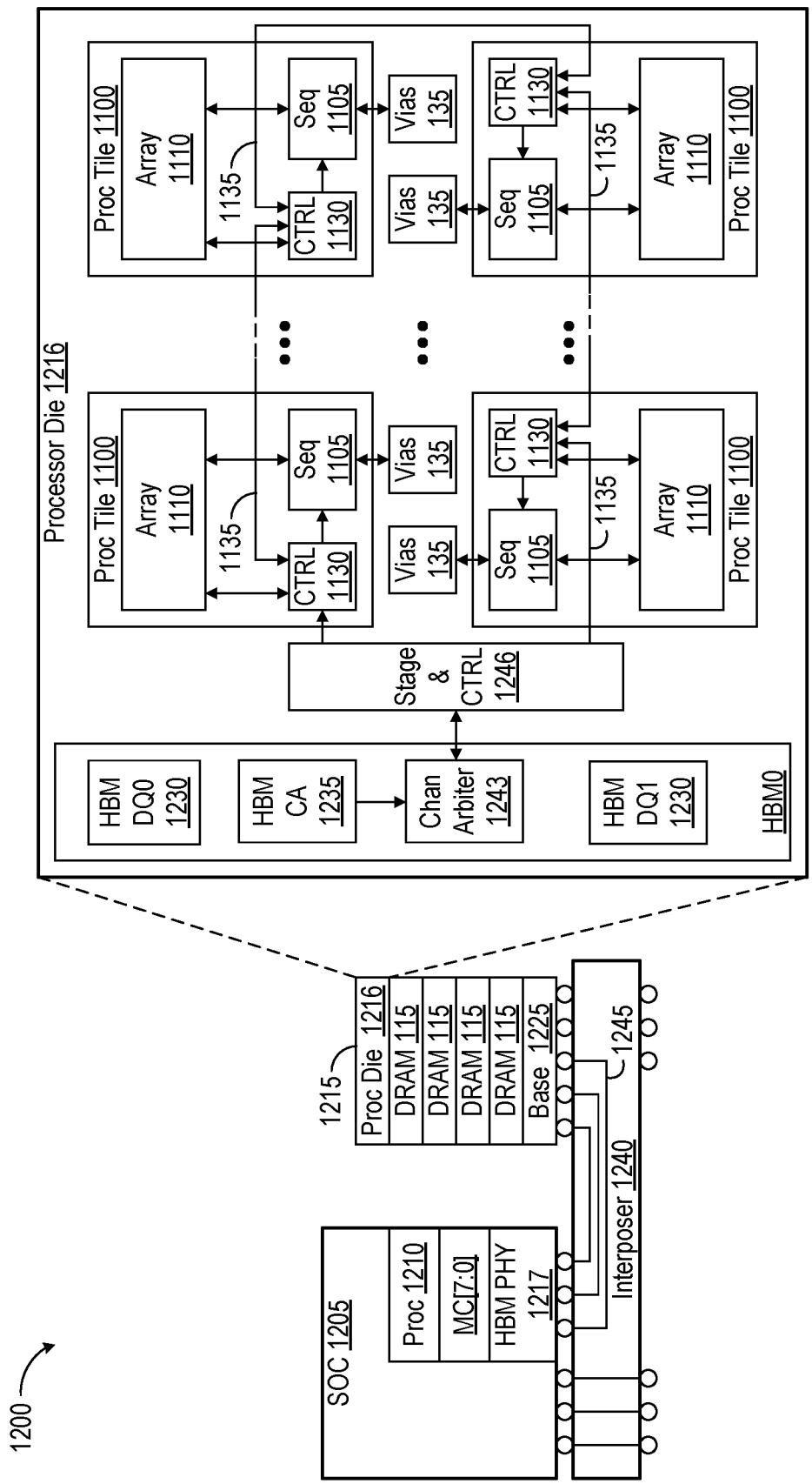
FIG. 12 depicts a computer system 1200 in which a system-on-a-chip (SOC) 1205 with host processor 1210 has access to a 3-D IC device 1215 that incorporates a processor die 1216, a stack of DRAM dies 115, and an optional base die 1225.

FIG. 12 depicts a computer system 1200 in which a system-on-a-chip (SOC) 1205 with host processor 1210 has access to a 3-D IC device 1215 that incorporates a processor die 1216, a stack of DRAM dies 115, and an optional base die 1225 that can e.g. support test functions for the DRAM stack during manufacturing, distribute power within the stack, and change the stack's ballout from the in-stack ballout to external microbumps. These and other functions can be incorporated on processor die 1216, or the work of the various dies can be distributed differently between them. SOC 1205 communicates with device 1215 via an interposer 1240 with finely spaced traces 1245 etched in silicon.

A block diagram of a portion of processor die 105 shows an external high-bandwidth-memory (HBM) interface HBM0 and an array of processing tiles 1100 of the type detailed in connection with FIG. 11. Device 1215 communicates with host SOC 1205 using an external memory interface comprising a pair of sub-interfaces 1230 and a command/address (CA) interface 1235. Memory dies 115, HBM DRAM in this embodiment, support high data bandwidth with a wide data interface. In one example, HBM channels include 1,024 data "wires" and hundreds more for command and address signals. Interposer 1240 is employed because standard printed-circuit boards (PCBs) have difficulty managing the requisite connection density. Interposer 1240 can be extended to include additional circuitry and can be mounted on some other form of substrate for interconnections to e.g. power-supply lines and additional instances of system 1200.

Die 1216 additionally includes a channel arbiter 1243 and a staging buffer/controller 1246. HBM CA interface 1235 receives command and address signals from SOC 1205 via interposer 1240, base die 1225, and via fields that extend through the various dies. Channel arbiter 1243 arbitrates between left and right staging buffers within staging buffer/controller 1246 in service of those commands. Channel arbiter 1235 is not needed if only one staging buffer is connected to a channel. Staging buffers can be included in support of rate matching so that read and write data bursts from and to processor die 1216 can be matched to the regular, pipelined movement of data through arrays 1110.

SOC 1205, as host controller, can change the operational mode of processor die 1216 using a number of approaches, some of which are discussed below. Staging buffer/controller 1246, an instance of which can be provided on the processor die for each external memory channel, monitors control switching status between the host controller and sequencers 1105 to manage internal and external operational modes. Sequencers 1105 can wait for a programmable period for control to be relinquished by the host controller. In one mode, each processor tile 1100 is provided direct access to an underlying stack of DRAM banks 120 under control of the respective sequencer 1105. In another mode, a processing tile 1100 is barred access to the underlying DRAM banks 120 to allow conflict-free access to those underlying banks by a different component (e.g. by a neighboring processing tile 1100). In still another mode, a processing tile 1100 is provided direct access to a first portion of the underlying stack of DRAM banks 120 under the control of its corresponding sequencer 1105 and is barred from access to a second portion of the underlying stack of DRAM banks 120 to allow conflict-free external access to another of processing tiles 1100 (e.g., an immediate neighbor).

The selected mode can be applied to any number of processing tiles, from one to all. In embodiments in which the memory dies are DRAM, maintenance operations (e.g. refresh and periodic calibration) can be managed by the active external or internal memory controller (e.g., SOC 1205, controller 1246, or sequencers 1105). Each sequencer 1105 can also monitor non-maintenance memory operations (e.g. whether a write and precharge sequence has been completed). The vertical-channel datapaths under control of sequencers 1105 can have a different data rate than the HBM-channel datapath, e.g. by not utilizing bank grouping or by being multiplexed inside of the serializer/deserializer chain of the HBM-channel datapath.

SOC 1205 supports an HBM interface that includes eight memory channels to processing device 1215. A processor 1210 is provided with eight memory controllers MC[7:0], one for each HBM channel, that are connected to a physical layer (PHY) 1217 to interface with device 1215. SOC 1205 additionally includes or supports, via hardware, software or firmware that manages mode selection for device 1215.

Processor 1210 supports up to eight independent read/write channels, one for each external memory controller MC[7:0], that communicate data, address, control, and timing signals as needed. In this context, "external" is with reference to device 1215 and is used to distinguish controllers (e.g. sequencers 1105) that are integrated with (internal to) device 1215. Memory controllers MC[7:0] and their respective portions of PHY 1217 support eight HBM channels—two channels per DRAM die 115—communicating data, address, control, and timing signals that comply with HBM specifications relevant to HBM DRAM dies 115 in this example. In the external-access mode, device 1215 interacts with SOC 1205 in the manner expected of an HBM memory.

While the subject matter has been described in connection with specific embodiments, other embodiments are also envisioned. For example, the foregoing embodiments detail relatively spartan tiles and arrays for ease of illustration; the number of arrays and processing elements per array vary widely, and practical neural networks can have many more arrays and many more processing elements per array. Moreover, some components are shown directly connected to one another while others are shown connected via intermediate components. In each instance the communicative coupling establishes some desired electrical communication between two or more circuit nodes, or terminals. Such coupling may often be accomplished using a number of circuit configurations, as will be understood by those of skill in the art. Other variations will be evident to those of skill in the art. Therefore, the spirit and scope of the appended claims should not be limited to the foregoing description. Only those claims specifically reciting "means for" or "step for" should be construed in the manner required under the sixth paragraph of 35 U.S.C. § 112.

What is claimed is:

1. An integrated circuit (IC) device comprising:
   stacked memory dies each having memory banks, the stacked memory dies including a first memory bank and a second memory bank; and
   a processor die bonded to the stacked memory dies and having:
      a first processing unit;
      a second processing unit;
      a first inter-die memory channel proximate to the first processing unit, remote from the second processing unit, and communicatively coupled to the first memory bank;
      a second inter-die memory channel proximate to the second processing unit, remote from the first processing unit, and communicatively coupled to the second memory bank; and
      a switch matrix communicatively coupled to the first processing unit, the first inter-die memory channel, the second processing unit, and the second inter-die memory channel, the switch matrix to selectively couple either of the first processing unit and the second processing unit to either of the first inter-die memory channel and the second inter-die memory channel;
      each of the first processing unit and the second processing unit including:
         an input port communicatively coupled to the switch matrix to receive read data from the communicatively coupled one of the first memory bank and the second memory bank; and
         an output port communicatively coupled to the switch matrix to convey write data to the communicatively coupled one of the first memory bank and the second memory bank;
      the switch matrix comprising a first switch communicatively coupled between the output port of the first processing unit and the input port of the second processing unit.

2. The device of claim 1, the switch matrix further comprising a second switch communicatively coupled between the first switch and each of the first inter-die memory channel and the second inter-die memory channel.

3. The device of claim 2, the switch matrix further comprising:
   a third switch communicatively coupled between the second switch and the first inter-die memory channel; and
   a fourth switch communicatively coupled between the second switch and the second inter-die memory channel.

4. The device of claim 1, wherein the first inter-die memory channel comprises a first via field extending to a first of the memory dies and the second inter-die memory channel comprises a second via field extending to a second of the memory dies.

5. The device of claim 1, further comprising a base die bonded to the processor die and the memory dies and communicatively coupled to the processor die.

6. The device of claim 1, the first processing unit comprising a first memory controller to read first data from the first memory bank and the second processing unit comprising a second memory controller to read second data from the second memory bank.

7. An integrated circuit (IC) device comprising:
stacked memory dies each having memory banks, the stacked memory dies including a first memory bank and a second memory bank; and
a processor die bonded to the stacked memory dies and having:
   a first processing unit comprising a first memory controller to read first data from the first memory bank;
   a second processing unit comprising a second memory controller to read second data from the second memory bank;
   a first inter-die memory channel proximate to the first processing unit, remote from the second processing unit, and communicatively coupled to the first memory bank;
   a second inter-die memory channel proximate to the second processing unit, remote from the first processing unit, and communicatively coupled to the second memory bank;
   a switch matrix communicatively coupled to the first processing unit, the first inter-die memory channel, the second processing unit, and the second inter-die memory channel, the switch matrix to selectively couple either of the first processing unit and the second processing unit to either of the first inter-die memory channel and the second inter-die memory channel; and
   a control channel between the first memory controller and the second memory controller, the control channel to issue read instructions from the first memory controller to the second memory controller.

8. The device of claim 7, the control channel to issue read instructions from the second memory controller to the first memory controller.

9. The device of claim 1, further comprising an external memory interface to connect to a memory controller external to the device, the external memory interface to communicate with the first memory bank and the second memory bank.

10. The device of claim 1, each processing unit comprising an array of processing elements.

11. An integrated circuit (IC) device comprising:
stacked memory dies each having a first memory bank and a second memory bank; and
a processor die bonded to the stacked memory dies and having:
   a first inter-die memory channel extending from the first memory bank to the processor die;
   a first sequencer communicatively coupled to the first inter-die memory channel to communicate first data between the first memory bank and the processor die;
   a second inter-die memory channel extending from the second memory bank to the processor die;
   a second sequencer communicatively coupled to the second inter-die memory channel to communicate second data between the second memory bank and the processor die;
   switching logic having a first switching-logic port communicatively coupled to the first sequencer to communicate the first data, a second switching-logic port communicatively coupled to the second sequencer to communicate the second data, and a third switching-logic port to communicate a selected one of the first data and the second data; and
   an array of processing elements communicatively coupled to the third switching-logic port to communicate the selected one of the first data and the second data;
   wherein the first sequencer is integrated on a first tile and the second sequencer is integrated on a second tile, the first tile further comprising a first tile controller directing the first sequencer and the second tile further comprising a second tile controller connected to the first tile controller and directing the second sequencer.

12. The IC device of claim 11, wherein the first tile controller directs the second sequence via the second tile controller.

13. The IC device of claim 11, the first tile including output switching logic communicatively coupled to the array of processing elements on the first tile, the output switching logic to alternatively convey operands from the array of processing elements on the first tile to the first sequencer and the second sequencer.

14. The IC device of claim 13, wherein the output switching logic conveys the operands from the array of processing elements to the second sequencer.

15. The IC device of claim 11, wherein the array of processing elements is a systolic array.

16. The IC device of claim 11, further comprising a base die bonded to the processor die and the stacked memory die, the base die including a memory interface to at least one of the processor die and the memory dies.

* * * * *